US006984845B2

(12) United States Patent
Khang

(10) Patent No.: US 6,984,845 B2
(45) Date of Patent: Jan. 10, 2006

(54) SINGLE-ELECTRON TRANSISTOR USING NANOPARTICLES

(75) Inventor: Yoon-ho Khang, Kyungki-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/724,052

(22) Filed: Dec. 1, 2003

(65) Prior Publication Data
US 2004/0159831 A1   Aug. 19, 2004

(51) Int. Cl.
H01L 29/78 (2006.01)
(52) U.S. Cl. .......................................... 257/24; 257/20
(58) Field of Classification Search ................ 257/20, 257/24
See application file for complete search history.

(56) References Cited

U.S. PATENT DOCUMENTS 5,701,017 A * 12/1997 Patel et al. .................. 257/27
6,103,600 A * 8/2000 Ueda et al. ................. 438/503
6,586,787 B1 * 7/2003 Shih et al. .................. 257/288
6,683,337 B2 * 1/2004 Forbes et al. ............... 257/215

OTHER PUBLICATIONS

D.V.Averin et al., "Abstract of Coulomb Blockade of Single-Electron Tunneling, and Coherent Oscillations in Small Tunnel Junctions", Journal of Low Temperature Physics, 1986, vol. 62, No. 3-4.

* cited by examiner

Primary Examiner—Jerome Jackson
(74) Attorney, Agent, or Firm—Buchanan Ingersoll PC

(57) ABSTRACT

A single-electron transistor using nanoparticles is provided. The single-electron transistor includes a first insulating film, a gate electrode patterned in a stripe form on the first insulating film, a second insulating film formed on exposed surfaces of the first insulating film and the gate electrode in such a way that a stepped portion is formed at a boundary between the gate electrode and the first insulating film, first and second electrodes formed on the second insulating film in such a way that a groove is formed at the stepped portion to expose a surface of the second insulating film, the first and second electrodes being separated from each other by the groove, and nanoparticles positioned at the groove and contacting with the first and second electrodes, the nanoparticles being channels for electron transfer. The single-electron transistor is manufactured using previously prepared nanoparticles and a general semiconductor process, thereby enabling low cost, mass production and operation at room temperature.

12 Claims, 7 Drawing Sheets

SINGLE-ELECTRON TRANSISTOR USING NANOPARTICLES

BACKGROUND OF THE INVENTION

1. Field of the Invention

The present invention relates to a single-electron transistor, and more particularly, to a single-electron transistor using nanoparticles.

2. Description of the Related Art

A single-electron transistor is a device that uses one electron to control a current by Coulomb blockade. The Coulomb blockade means a phenomenon that tunneling of an electron into a dot is blocked by a Coulomb repulsive interaction of it with another electron previously present in the dot.

Generally, current-voltage characteristics of a tunnel junction having a size of less than 100 nm and an appropriate resistance level do not follow Ohm's law. Rather, a current generated by tunneling of an electron at a low voltage approximates to zero. This phenomenon is generated by an electrostatic interaction of a tunneling electron and a charged medium. A theory based on quantum mechanics explains the phenomenon (for example, see Likharev et al., (1986)) and this phenomenon was first observed in an artificially formed micro-junction in 1987.

According to the above phenomenon, a single-electron transistor can be operated by one electron at less than a predetermined temperature. Here, the "predetermined temperature" means a temperature at which a thermal energy ($K_B T$) is less than an electrostatic energy ($e^2/C$) required for charging one electron in a junction of the single-electron transistor, i.e., a temperature satisfying the following equation 1:

$$T \ll \frac{e^2}{K_B \times C} \quad \text{Equation 1}$$

wherein $K_B$ is Boltzmann constant ($1.38 \times 10^{-23}$ J/K). An electrostatic capacitance (C) is proportional to the size of a channel. In this regard, in order to observe the Coulomb blockade phenomenon at a desired temperature, the size of a channel must be reduced.

In a conventional single-electron transistor, a channel is formed to a narrow width by photolithography or e-beam lithography. However, with respect to the photolithography, it is difficult to form a small channel enough to be used at room temperature. The e-beam lithography can allow for the formation of a relatively small-sized channel, but is not suitable for commercial applications requiring mass production.

SUMMARY OF THE INVENTION

The present invention provides a single-electron transistor having a channel narrow enough for operation at room temperature, which can be manufactured in large scale.

According to an aspect of the present invention, there is provided a single-electron transistor comprising: a first insulating film; a gate electrode patterned in a stripe form on the first insulating film; a second insulating film formed on exposed surfaces of the first insulating film and the gate electrode in such a way that a stepped portion is formed at a boundary between the gate electrode and the first insulating film; first and second electrodes formed on the second insulating film in such a way that a groove is formed at the stepped portion to expose a surface of the second insulating film, the first and second electrodes being separated from each other by the groove; and nanoparticles positioned at the groove and contacting with the first and second electrodes, the nanoparticles being channels for electron transfer.

According to another aspect of the present invention, there is provided a single-electron transistor comprising: a first electrode; a first insulating film patterned in a stripe form on the first electrode to expose a surface of the first electrode; a second electrode formed on the first insulating film; nanoparticles formed on the exposed surface of the first electrode and contacting with the first electrode and the second electrode, the nanoparticles being channels for electron transfer; a second insulating film covering the first electrode, the second electrode, and the nanoparticles; and a gate electrode formed on the second insulating film.

The first electrode may be a source electrode and the second electrode may be a drain electrode or the first electrode may be a drain electrode and the second electrode may be a source electrode.

The nanoparticles may be composite structures obtained by coating a core made of one of Group IIB-VIA compounds including CdS, CdSe, and CdTe, one of Group IIIA-VA compounds including GaAs, one of Group IVA elements including Si and compounds thereof, or one of metals including Ni, Co, Fe, Pt, Au, and Ag and compounds thereof, with one of the forgoing core materials. The nanoparticles may be carbon nanotubes.

According to the present invention, previously prepared nanoparticles are used as channels. Therefore, a channel narrow enough for operation at room temperature can be obtained at room temperature. Consequently, a conventional semiconductor process can be used and a mass-production is possible.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
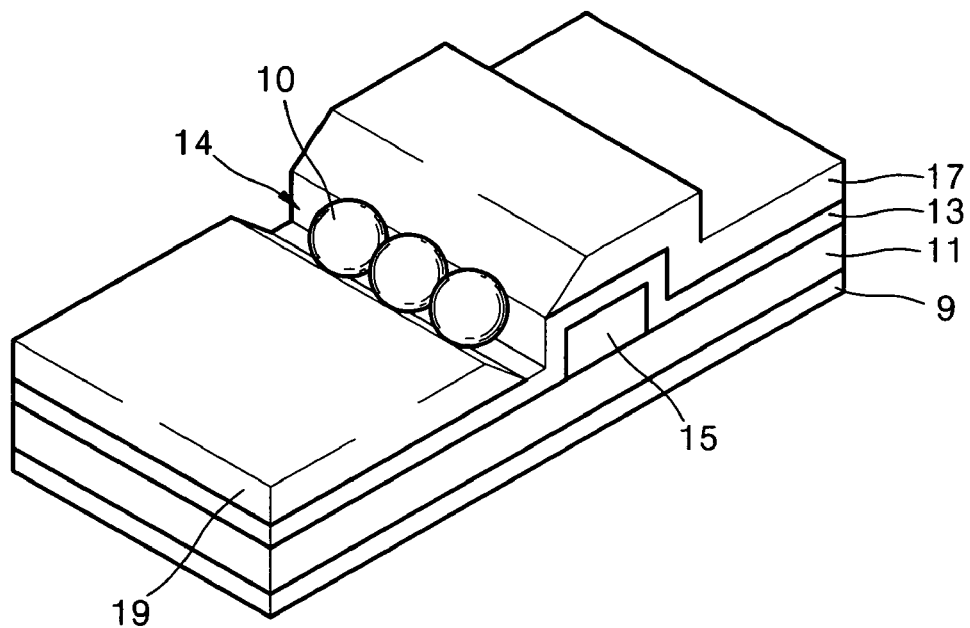
FIG. 1 is a perspective view of a single-electron transistor according to a first embodiment of the present invention.

Hereinafter, single-electron transistors using nanoparticles according to embodiments of the present invention will be described in detail with reference to the accompanying drawings. The same reference numerals in different drawings indicate the same constitutional elements. The sizes of nanoparticles and the thicknesses and widths of constitutional elements have been exaggerated for illustration.

FIG. 1 is a perspective view of a single-electron transistor using nanoparticles according to a first embodiment of the present invention.

Referring to FIG. 1, the single-electron transistor according to the first embodiment of the present invention comprises a substrate 9, a first insulating film 11 formed on the substrate 9, a gate electrode 15 patterned in a stripe form of a predetermined width on the first insulating film 11, and a second insulating film 13 formed on exposed surfaces of the first insulating film 11 and the gate electrode.

A metal layer is deposited on the second insulating film 13 by sputtering or evaporation. A groove 14 is formed at a stepped portion, i.e., at a boundary of the first insulating film 11 and the gate electrode 15 to expose a surface of the second insulating film 13. As a result, the metal layer is separated into two regions to thereby serve as a source electrode 19 and a drain electrode 17.

Nanoparticles 10 previously prepared in a physical or chemical method are positioned on the exposed surface of the second insulating film 13 in the groove 14 and contact with the source and drain electrodes 19 and 17. Here, the source electrode 19 and the drain electrode 17 can change with each other.

The nanoparticles 10 are previously prepared in a physical or chemical method.

With respect to a chemical method, the nanoparticles 10 may be composite structures obtained by coating a core made of one of Group IIB-VIA compounds including CdS, CdSe, and CdTe, one of Group IIIA-VA compounds including GaAs, one of Group IVA elements including Si and compounds thereof, or one of metals including Ni, Co, Fe, Pt, Au, and Ag and compounds thereof and a coating of a different material.

For example, in order to form (CdSe)ZnS nanoparticles, first, CdSe nanocrystals are prepared. In this case, the nanoparticles 10 have sizes of 10 to 1000 Å. A size variation is less than 30%.

For example, the CdSe nanocrystals are formed by high-temperature colloid growth and precipitation for size selection. The term, "high-temperature colloid growth" as used herein means that organic metal precursors are rapidly injected into a high-temperature solvent to grow homogeneous cores at once.

Preferably, an organic metal precursor that can be used as a Cd source includes an alkaline cadmium compound such as $CdMe_2$. An organic metal precursor that can be used as a Se source includes trialkylphosphine selenide such as bis(trimethylsilyl) selenium $((TMS)_2Se)$, trioctylphosphine selenide (TOPSe), and tributylphosphine selenide (TBPSe).

Next, the CdSe nanocrystals are coated with a solution containing a zinc (Zn) precursor and a sulfur (S) precursor in a solvent (for example, TOP) at an appropriate temperature. Diethylzinc and hexamethyidisiloxane are used as the Zn precursor and the S precursor, respectively.

A physical method for formation of the nanoparticles 10 includes vapor condensation synthesis, laser ablation synthesis, and ball-mill method.

Single-wall or multi-wall carbon nanotubes prepared by a physical or chemical method can be used as the nanoparticles 10.

The nanoparticles 10 are sprayed so that they are positioned on the exposed surface of the second insulating film 13 in the groove 14. The sprayed nanoparticles 10 contact with the source and drain electrodes 19 and 17, to thereby serve as channels for electron transfer.

The first and second insulating films 11 and 13 are made of an insulating material such as $SiO_2$ and have a thickness of 10 to 1000 Å. The gate electrode 15 is made of a conductive material such as Al and has a thickness of 10 to 1000 Å. The source and drain electrodes 19 and 17 are formed by depositing a metal layer using sputtering or evaporation. The groove 14 is positioned between the source and drain electrodes 19 and 17 to expose a surface of the second insulating film 13.

Figure 2:
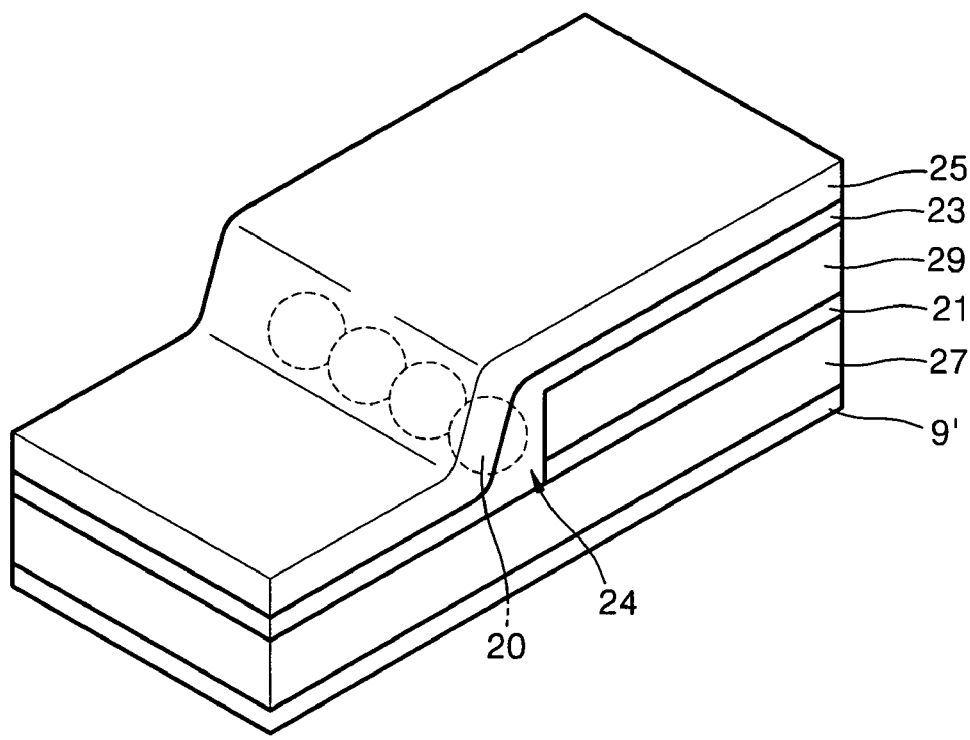
FIG. 2 is a perspective view of a single-electron transistor according to a second embodiment of the present invention.

FIG. 2 is a view of a single-electron transistor according to a second embodiment of the present invention.

Referring to FIG. 2, the single-electron transistor according to the second embodiment of the present invention comprises a substrate 9', a drain electrode 27 formed on the substrate 9', a first insulating film 21 patterned in a stripe form of a predetermined width on the drain electrode 27, a source electrode 29 patterned in a stripe form of the same area as the first insulating film 21 on the first insulating film 21, nanoparticles 20 formed at a stepped portion between the source electrode 29 and the drain electrode 27 and contacting with the source electrode 29 and the drain electrode 27, a second insulating film 23 and a gate electrode 25 orderly formed on the source and drain electrodes 29 and 27 to cover the source and drain electrodes 29 and 27.

Although the single-electron transistors according to the first and second embodiments of the present invention have different structures, they carry out the same functions. The detailed descriptions of the nanoparticles 20, the first and second insulating films 21 and 23, and the source and drain electrodes 29 and 27 are as described in the single-electron transistor according to the first embodiment of the present invention. The source and drain electrodes 29 and 27 can change with each other.

The nanoparticles 10 according to the first embodiment of the present invention are exposed on a surface of the transistor. Therefore, the single-electron transistor according to the first embodiment of the present invention can be easily applied in sensors or optical displays using nanoparticles. On the other hand, according to the second embodiment of the present invention, the nanoparticles 20 strongly contacts with the source and drain electrodes 29 and 27. Therefore, the single-electron transistor according to the second embodiment of the present invention can be easily applied in high-speed, highly integrated logic devices.

Figure 3A:
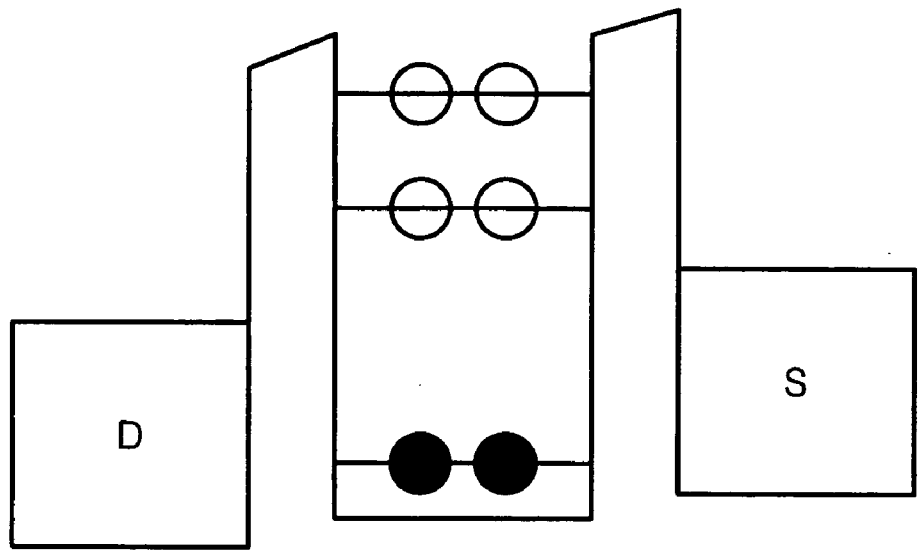
FIG. 3A is a diagram showing an OFF state of a single-electron transistor according to an embodiment of the present invention.
Figure 3B:
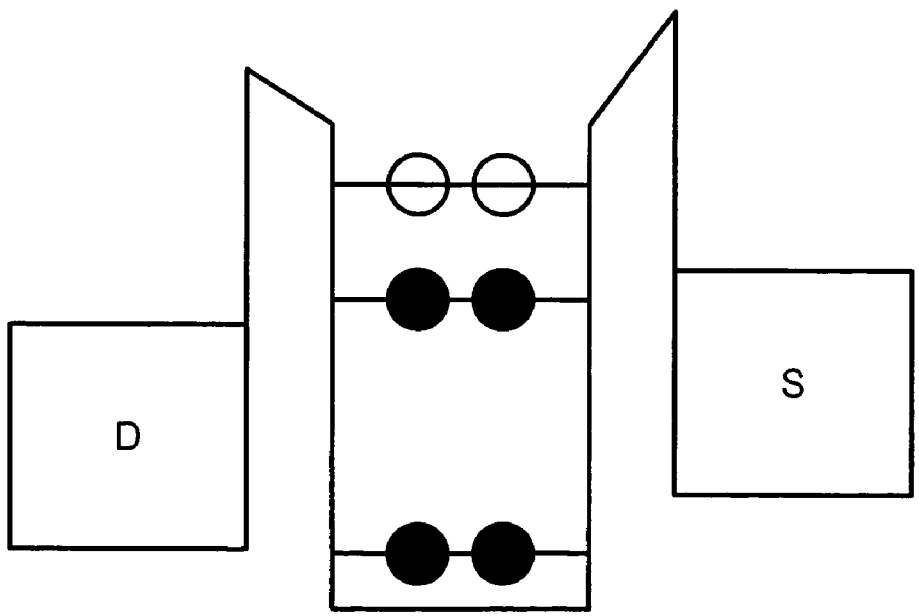
FIG. 3B is a diagram showing an ON state of a single-electron transistor according to an embodiment of the present invention.

FIGS. 3A and 3B are views showing an operation principle of a single-electron transistor according to an embodiment of the present invention.

FIG. 3A shows an OFF state of a single-electron transistor. In this case, there is no electron transfer from a source electrode S to a drain electrode D. Nanoparticles have discontinuous energy levels. Electrons of predetermined number occupy higher energy levels after lower energy levels have been filled.

Referring to FIG. 3A, first, electrons derived from the source electrode S occupy the lowest energy level of the nanoparticles. The energy level of the electrons that have entered into the nanoparticles is lower than that of the drain electrode D. Therefore, electrons are trapped in a potential wall, and thus, cannot be transferred to the drain electrode D. In addition, when electrons of predetermined number are filled in the nanoparticles, the Coulomb blockade which is characteristics of a single-electron transistor occurs. As a result, entry of another electrons is blocked by previously filled electrons. Therefore, electron transfer is blocked from the source electrode S to the drain electrode D, thereby resulting in no current flow.

Meanwhile, FIG. 3B shows an ON state at which electrons transfer from the source electrode S to the drain electrode D. The potential of the nanoparticles is generally low, in comparison with FIG. 3A. A single-electron transistor according to an embodiment of the present invention lowers a potential wall when a voltage is applied to the gate electrode, to thereby allow transfer of electrons filled in the nanoparticles.

Referring to FIG. 3B, when electrons derived from the source electrode S first occupy the lowest energy level of the nanopaprticles, subsequent electrons occupy a next energy level. Electrons that have entered into an energy level higher than the potential of the drain electrode D transfer to the drain electrode D due to a potential difference. Therefore, a tunneling current flows, thereby leading to an ON state of a transistor.

FIGS. 4A through 4E are views showing processes of forming the single-electron transistor according to the first embodiment of the present invention.

Figure 4A:
FIGS. 4A through 4E are views showing processes of forming the single-electron transistor according to the first embodiment of the present invention.
Figure 4B:
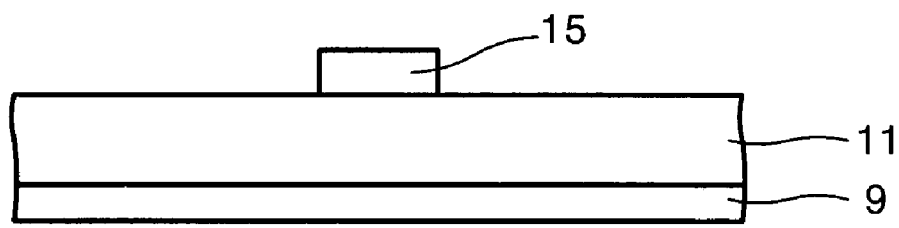

Referring to FIG. 4A, in order to form the single-electron transistor according to the first embodiment of the present invention, a first insulating film 11 is first formed on a substrate 9. Then, a gate electrode 15 is patterned in a stripe shape of a predetermined width on the first insulating film 11, as shown in FIG. 4B. For this, a material for the gate electrode is deposited on the first insulating film 11 and is coated with photoresist. Then, a mask of the gate electrode 15 shape is positioned on the first insulating film 11, followed by exposure to light, developing, etching, and washing.

Figure 4C:
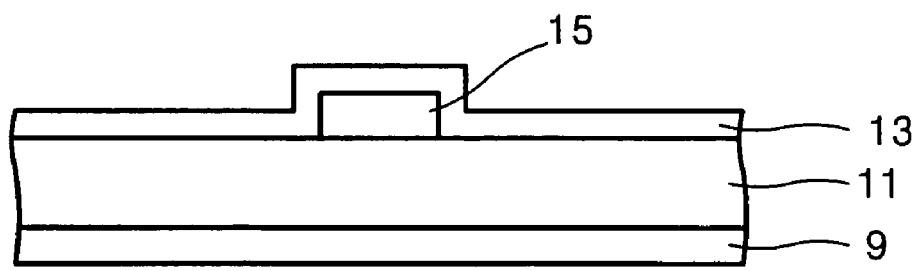

Next, a second insulating film 13 is formed on exposed surfaces of the first insulating film 11 and the gate electrode 15, as shown in FIG. 4C.

Figure 4D:
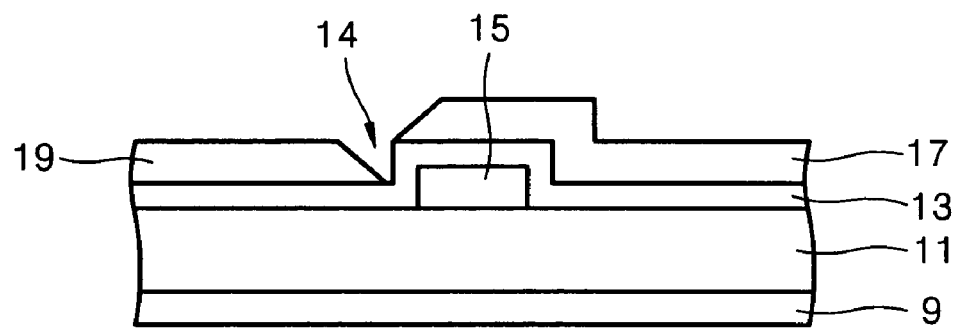

Next, a metal layer is formed on the second insulating film 13, for example using sputtering, as shown in FIG. 4D. The sputtering uses a principle that when inert gaseous ionic plasma of a high momentum collides with target materials such as Al, surface particles of the target materials are ejected by momentum transfer from the gaseous ionic plasma and are then deposited on a substrate.

In the sputtering, lowering of step coverage makes it possible to prevent deposition of the metal layer at a stepped portion of the gate electrode 15, thereby exposing a surface of the second insulating film 13. Therefore, the metal layer is formed into two regions to thereby serve as the source and drain electrodes 19 and 17.

Figure 4E:
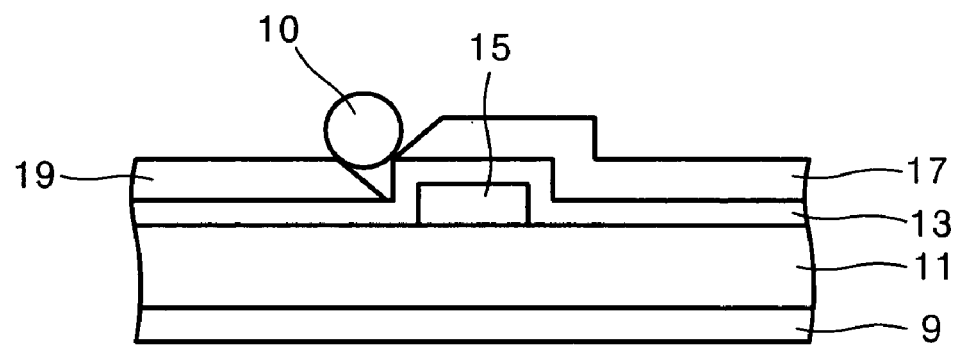

Finally, as shown in FIG. 4E, a solution containing the nanoparticles 10 is sprayed on the groove 14 thus formed and then only solvent is evaporated. As a result, the nanoparticles 10 contacting with the source and the drain electrodes 19 and 17 are formed. The nanoparticles 10 contacting with the source and drain electrodes 19 and 17 are in an ON or OFF state according to the voltage of the gate electrode 15.

FIGS. 5A through 5D are views showing processes of forming the single-electron transistor according to the second embodiment of the present invention.

Figure 5A:
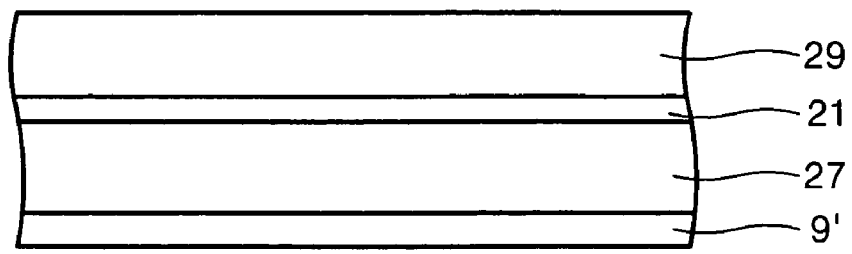
FIGS. 5A through 5D are views showing processes of forming the single-electron transistor according to the second embodiment of the present invention.
Figure 5B:
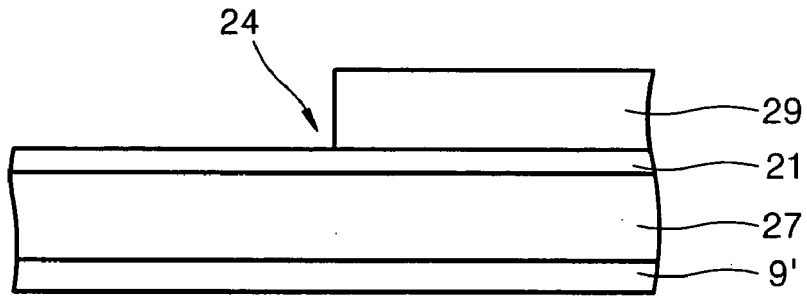

A drain electrode 27 is first formed on a substrate 9', as shown in FIG. 5A and then a first insulating film 21 is formed on the drain electrode 27, as shown in FIG. 5B. Then, a source electrode 29 is patterned in a stripe form of a predetermined width on the drain electrode 27 to form a stepped portion 24.

Figure 5C:
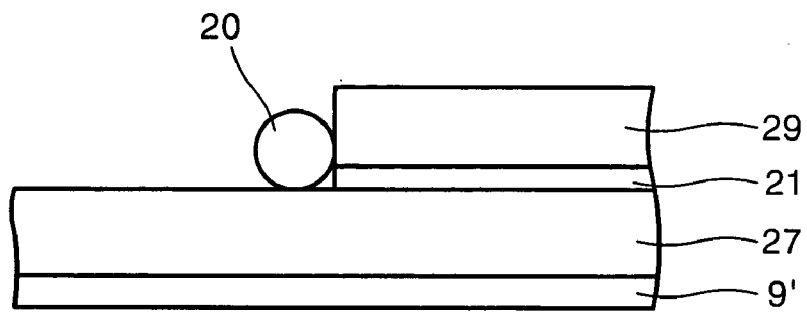
Figure 5D:
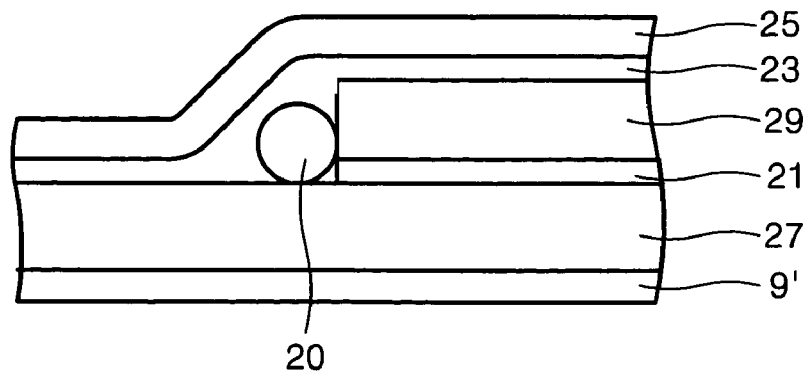

Next, as shown in FIG. 5C, a solution containing nanoparticles 20 previously prepared by a physical or chemical method is sprayed on the stepped portion and then only solvent is evaporated. As a result, the nanoparticles 20 contacting with the source and the drain electrodes 29 and 27 are formed. Finally, as shown in FIG. 5D, the source electrode 29, the drain electrode 27, and the nanoparticles 20 are covered with a second insulating film 23. A gate electrode 25 is formed on the second insulating film 23.

Figure 6A:
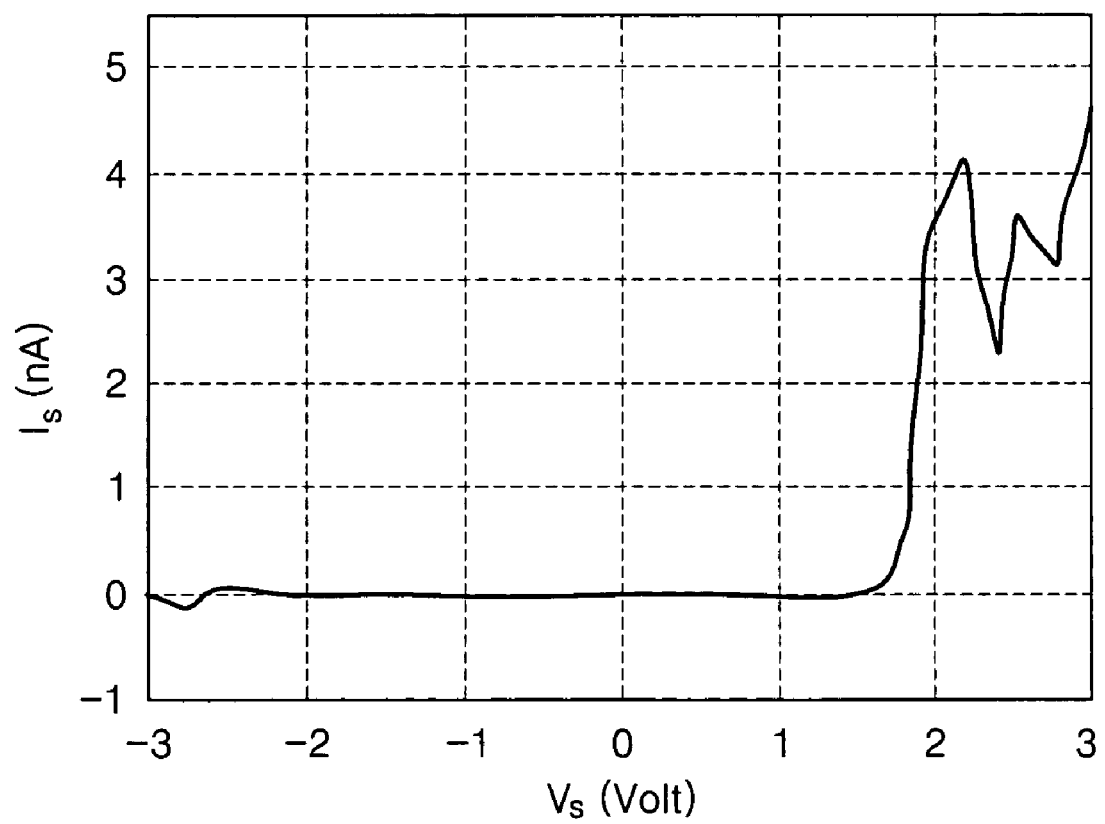
FIGS. 6A and 6B are graphs showing electrical characteristics of the single-electron transistor according to the first embodiment of the present invention.
Figure 6B:
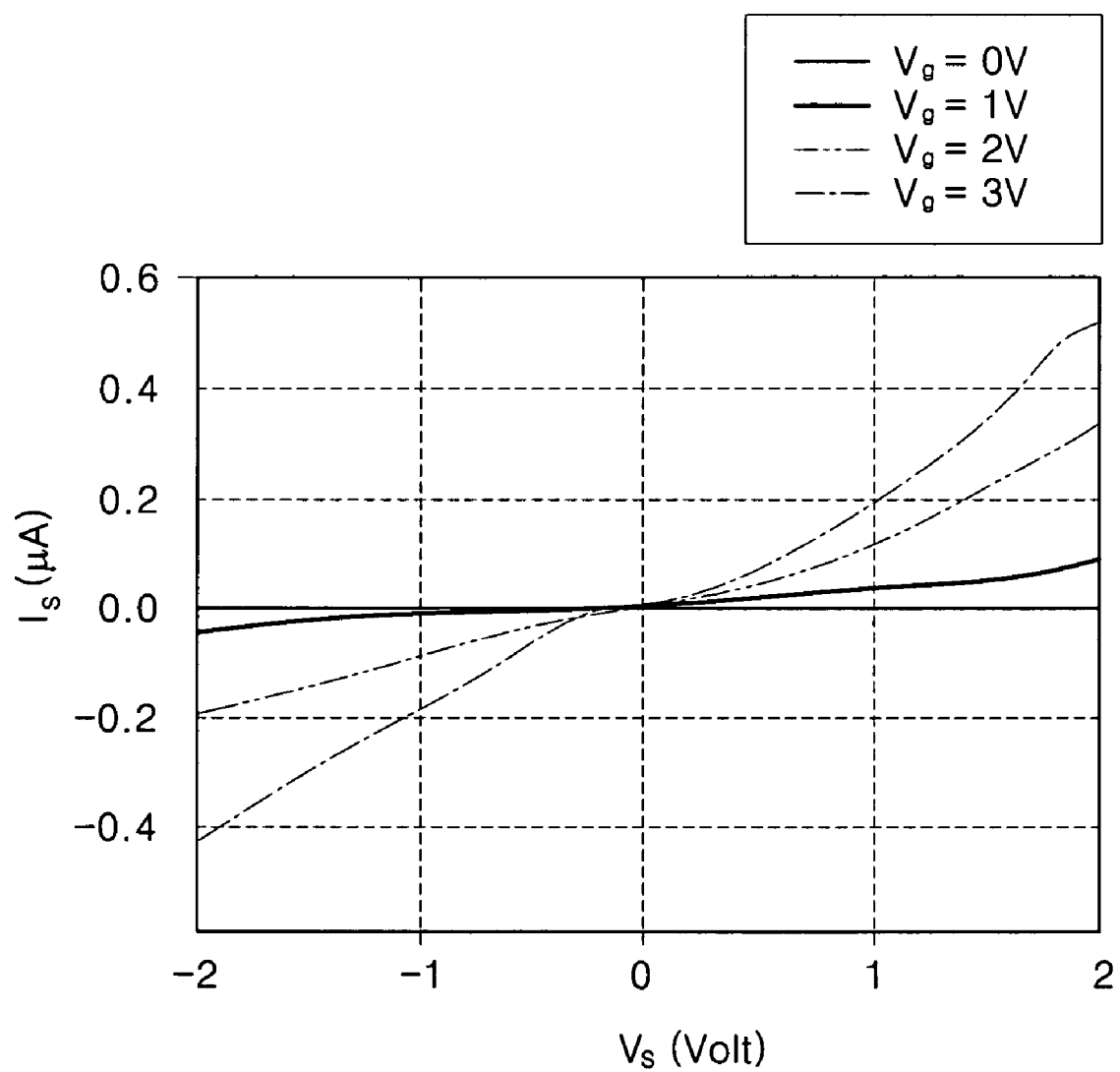

FIGS. 6A and 6B are graphs showing electrical characteristics of the single-electron transistor according to the first embodiment of the present invention. FIG. 6A shows a change of the current Is between the source electrode 19 and the drain electrode 17 according to the voltage (−3 to 3 V) between the source electrode 19 and the drain electrode 17 when the voltage Vg of the gate electrode 15 is maintained at 0.5 V. It can be seen from FIG. 6A that the single-electron transistor exhibits diode characteristics. FIG. 6B shows a change of the current Is between the source electrode 19 and the drain electrode 17 according to the voltage Vs between the source electrode 19 and the drain electrode 17 with varying the voltage Vg of the gate electrode 15. It can be seen from FIG. 6B that the single-electron transistor exhibits basic transistor characteristics.

As is apparent from the above description, in a single-electron transistor according to the present invention, a groove is formed between a source electrode and a drain electrode by a poor step coverage intentionally induced during sputtering. Therefore, an inexpensive single-electron transistor can be manufactured.

In addition, a single-electron transistor according to the present invention can be manufactured in a large scale using previously prepared nanoparticles and a conventional semiconductor manufacture process.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A single-electron transistor comprising:
   a first insulating film;
   a gate electrode patterned in a stripe form on the first insulating film;
   a second insulating film formed on exposed surfaces of the first insulating film and the gate electrode in such a way that a stepped portion is formed at a boundary between the gate electrode and the first insulating film;
   first and second electrodes formed on the second insulating film in such a way that a groove is formed at the stepped portion to expose a surface of the second insulating film, the first and second electrodes being separated from each other by the groove; and
   nanoparticles positioned at the groove and contacting the first and second electrodes, the nanoparticles being channels for electron transfer.

2. The single-electron transistor according to claim 1, wherein the first electrode is a source electrode and the second electrode is a drain electrode.

3. The single-electron transistor according to claim 1, wherein the nanoparticles are composite structures including a core made of one of Group IIB-VIA compounds including CdS, CdSE, and CdTe, one of Group IIIA-VA compounds including GaAs, one of Group IVA elements including Si and compounds thereof, or one of metals including Ni, Co, Fe, Pt, Au, and Ag and compounds thereof, and a coating of a different material.

4. The single-electron transistor according to claim 1, wherein the nanoparticles are carbon nanotubes.

5. A single-electron transistor comprising:
a first electrode;
a first insulating film patterned in a stripe form on the first electrode to expose a surface of the first electrode;
a second electrode formed on the first insulating film;
nanoparticles formed on the exposed surface of the first electrode and contacting the first electrode and the second electrode, the nanoparticles being channels for electron transfer;
a second insulating film covering the first electrode, the second electrode, and the nanoparticles; and
a gate electrode formed on the second insulating film.

6. The single-electron transistor according to claim 5, wherein the first electrode is a source electrode and the second electrode is a drain electrode.

7. The single-electron transistor according to claim 5, wherein the nanoparticles are composite structures including a core made of one of Group IIB-VIA compounds including CdS, CdSE, and CdTe, one of Group IIIA-VA compounds including GaAs, one of Group IVA elements including Si and compounds thereof, or one of metals including Ni, Co, Fe, Pt, Au, and Ag and compounds thereof and a coating of a different material.

8. The single-electron transistor according to claim 5, wherein the nanoparticles are carbon nanotubes.

9. The single-electron transistor according to claim 1, wherein the first electrode is a drain electrode and the second electrode is a source electrode.

10. The single-electron transistor according to claim 5, wherein the first electrode is a drain electrode and the second electrode is a source electrode.

11. The single-electron transistor according to claim 3, wherein the coating is ZnS.

12. The single-electron transistor according to claim 7, wherein the coating is ZnS.

* * * * *